(12) United States Patent
Bessho et al.

(10) Patent No.: US 11,026,340 B2
(45) Date of Patent: Jun. 1, 2021

(54) PASSENGER PROTECTION CONTROL DEVICE

(71) Applicant: VEONEER SWEDEN AB, Vårgårda (SE)

(72) Inventors: Shuichi Bessho, Yokohama (JP); Kentaro Akiyama, Yokohama (JP); Aki Wada, Yokohama (JP); Kouhei Torii, Yokohama (JP)

(73) Assignee: VEONEER SWEDEN AB, Vargarda (SE)

( * ) Notice: Subject to any disclaimer, the term of this patent is extended or adjusted under 35 U.S.C. 154(b) by 0 days.

(21) Appl. No.: 16/348,885

(22) PCT Filed: Oct. 11, 2017

(86) PCT No.: PCT/JP2017/036792
§ 371 (c)(1),
(2) Date: May 10, 2019

(87) PCT Pub. No.: WO2018/088095
PCT Pub. Date: May 17, 2018

(65) Prior Publication Data
US 2019/0281718 A1    Sep. 12, 2019

(30) Foreign Application Priority Data
Nov. 11, 2016    (JP) .............................. JP2016-220355

(51) Int. Cl.
*H05K 5/00* (2006.01)
*H05K 5/06* (2006.01)
(Continued)

(52) U.S. Cl.
CPC ............. *H05K 5/069* (2013.01); *B60R 16/02* (2013.01); *B60R 16/0239* (2013.01);
(Continued)

(58) Field of Classification Search
CPC ....................................................... H05K 5/00
See application file for complete search history.

(56) References Cited

U.S. PATENT DOCUMENTS 9,093,776 B2    7/2015    Yamanaka et al.
9,204,562 B2    12/2015    Shimizu et al.
(Continued)

FOREIGN PATENT DOCUMENTS

| CN | 101380932 A | 3/2009 |
| CN | 101384145 A | 3/2009 |

(Continued)

OTHER PUBLICATIONS

International Search Report (in English and Japanese) and Written Opinion (in Japanese) issued in PCT/JP2017/036792, dated Jan. 9, 2018; ISA/JP.

(Continued)

*Primary Examiner* — Jerry Wu
(74) *Attorney, Agent, or Firm* — Stephen T. Olson; Harness, Dickey & Pierce, P.L.C.

(57) ABSTRACT

A passenger protection control device for effectively preventing an infiltration of water into the interior of a case without the use of a sealant includes: a printed circuit board; a connector; and a case that accommodates such that, while a connection end surface with a wire harness of the connector is exposed, the printed circuit board is isolated from the outside. The case is formed by: a box shaped cover in which the periphery of a ceiling wall is enclosed by side walls and a floor surface is opened; and a rear cover that plugs the floor surface of the cover. The connector is installed in an opening provided in the side wall of the cover. The rear cover has a first standing wall projecting so as to face a connector in the portion of the cover in which the connector is installed. The first standing wall of the rear cover has a planar region in a head top part. The planar (Continued)

region has an inclined surface having a falling gradient facing outwardly from the cover.

21 Claims, 8 Drawing Sheets

(51) Int. Cl.
*H05K 5/02* (2006.01)
*B60R 16/023* (2006.01)
*B60R 21/013* (2006.01)
*H02G 3/16* (2006.01)
*B60R 16/02* (2006.01)
*B60R 21/01* (2006.01)

(52) U.S. Cl.
CPC ............ *B60R 21/013* (2013.01); *H02G 3/16* (2013.01); *H05K 5/0069* (2013.01); *H05K 5/0078* (2013.01); *H05K 5/02* (2013.01); *B60R 2021/01286* (2013.01)

(56) References Cited

U.S. PATENT DOCUMENTS

| | | | |
|---|---|---|---|
| 9,301,418 | B2 | 3/2016 | Nuriya et al. |
| 9,462,715 | B2 | 10/2016 | Nuriya et al. |
| 2004/0217938 | A1* | 11/2004 | Abe .................. G05G 9/047 345/156 |
| 2008/0158830 | A1* | 7/2008 | Tominaga ............... H05K 3/32 361/722 |
| 2009/0057006 | A1 | 3/2009 | Kishibata et al. |
| 2013/0265728 | A1 | 10/2013 | Sakai |
| 2015/0016076 | A1 | 1/2015 | Shimizu et al. |
| 2015/0216070 | A1 | 7/2015 | Nuriya et al. |
| 2015/0282362 | A1 | 10/2015 | Nuriya et al. |

FOREIGN PATENT DOCUMENTS

| | | |
|---|---|---|
| CN | 101874332 A | 10/2010 |
| CN | 103369893 A | 10/2013 |
| CN | 104137364 A | 11/2014 |
| CN | 104955301 A | 9/2015 |
| CN | 104955301 A | 9/2015 |
| DE | 112013001161 T5 | 11/2014 |
| DE | 102014218417 A1 | 10/2015 |
| JP | 2009064916 A | 3/2009 |
| JP | 2011150895 A | 8/2011 |
| JP | 2013176242 A | 9/2013 |
| JP | 2013179364 A | 9/2013 |
| JP | 2015138923 A | 7/2015 |
| JP | 2015191995 A | 11/2015 |

OTHER PUBLICATIONS

Extended European Search Report received for the European Patent Application No. EP17870480.5, dated May 15, 2020, 10 pages.
Communication pursuant to Rules 70(2) and 70a{2} EPC received for the European Patent Application No. EP17870480.5, dated Jun. 3, 2020, 1 page.
Office Action received for the Chinese Patent Application No. 201780069899.4, dated Mar. 31, 2020, 16 pages (8 pages of Original Copy and 8 pages of English Translation).

* cited by examiner (a)

(b)

PASSENGER PROTECTION CONTROL DEVICE

CROSS-REFERENCE TO RELATED APPLICATIONS

This application is a 371 U.S. National Stage of International Application No. PCT/JP2017/036792, filed on Oct. 11, 2017, which claims priority to Japanese Application No. 2016-220355, filed on Nov. 11, 2016. The entire disclosures of the above applications are incorporated herein by reference.

FIELD OF THE INVENTION

The present invention relates to an electronic control unit (ECU) which electrically controls the activation of an air bag, seat belt, etc. installed in an automobile as a safety device in order to protect passengers. This electronic control unit is hereinafter referred to as a passenger protection control device.

BACKGROUND

For example, air bag devices eject gas from an inflator upon crashing so as to deploy an air bag and protect passengers from impact upon crashing. In these air bag devices, activation of the inflator is electrically controlled by a passenger protection control device.

As illustrated in FIGS. 5 and 6, this passenger protection control device has: a case 1 configured of a cover 11 and a rear cover 12; a connector 2 connected to a wire harness; and a printed circuit board 3.

In addition, by attaching the printed circuit board 3 to the cover 11 together with the rear cover 12 using screw shafts 4, the printed circuit board 3 is accommodated in the case 1 so as to be isolated from the outside. In this state, as illustrated in FIG. 8, a connection end surface 2a with a wire harness of the connector 2 attached to the printed circuit board 3 is exposed from the cover 11.

For example, three locations among four corners of the rear cover 12 are projected outward so as to be exposed from the cover 11, with each hole 12aa provided in this projected flange 12a. In addition, the passenger protection control device is attached to a vehicle body by screwing each bolt inserted into the hole 12aa into a screw hole provided in the vehicle body.

Moreover, upon determining that an automobile has crashed based on the acceleration or deceleration detected by a sensor, a control circuit for outputting a control signal for deploying the air bag is printed on the printed circuit board 3.

Patent Documents 1 and 2 disclose a passenger protection control device, wherein protrusions and recessed parts are formed on the abutting surface between a connector and a cover, the abutting surface between the connector and a rear cover, and the abutting surface between the cover and the rear cover, these protrusions and recessed parts are fitted to each other, and a sealant is filled into each fitting part so as to be sealed. This configuration prevents water from infiltrating the interior of a case, preventing further damage to the printed circuit board.

Unfortunately, the sealant is disadvantageously cracked due to temperature changes, vibrations, secular changes, etc. The sealability of the cracked sealant may deteriorate, allowing water to infiltrate the interior of the case.

Moreover, due to the limited product shape, for example, a fitting part may not be able to be formed on the abutting surface between the connector and the rear cover. Further, the abutting surface may not be able to be formed as a sealing surface or the sealant may not be able to be used due to a request by a customer. In such a case, water may infiltrate the interior of the case.

PRIOR ART DOCUMENTS

Patent Documents

Patent Document 1: JP 2015-138923 A
Patent Document 2: JP 2015-191995 A

SUMMARY OF THE INVENTION

Problems to be Solved by the Invention

Problems to be solved by the present invention are as follows:

a) if a sealant is filled into a fitting part so as to be sealed but cracks, the sealability may deteriorate and allow water to infiltrate the interior of the case; and b) due to the limited product shape, if a fitting part cannot be formed, a sealing surface may not be able to be formed or the sealant may not be able to be used, causing water to potentially infiltrate the interior of the case.

Solution to Problems

An object of the passenger protection control device according to the present invention is to prevent the infiltration of water into the interior of a case without the use of a sealant.

That is, the passenger protection control device according to the present invention includes:

a printed circuit board with a control circuit for outputting a control signal printed thereon;

a connector attached to this printed circuit board; and a case that accommodates such that, while a connection end surface with a wire harness of the connector is exposed, the printed circuit board is isolated from the outside.

In addition, most primarily characteristically, the case includes:

a box shaped cover in which the periphery of a ceiling wall is enclosed by side walls and a floor surface is opened, with the connector installed in an opening provided on the side walls; and a rear cover that plugs the floor surface of the cover and has a first standing wall projecting so as to face the connector in the portion of the cover in which the connector is installed, wherein the first standing wall of the rear cover has a planar region in a head top part, while the planar region has an inclined surface having a falling gradient facing outwardly from the cover.

The side wall regions for installing the connector remove a side wall from below the floor surface side. Consequently, because a space is present below the connector in the installation state, a liquid, for example, water tends to infiltrate the interior of a case. In the event of the infiltration of water, this water contacts the printed circuit board. Then, in the present invention, for example, in order to prevent the infiltration of water into the interior of the case, the first standing wall projecting so as to face the connector is provided on the rear cover.

Moreover, in the present invention, the planar region is formed in the head top part of the first standing wall of the rear cover configuring the case. In addition, this planar region has an inclined surface having a falling gradient facing outwardly from the cover configuring the case. Consequently, for example, even if water gets over the first standing wall to infiltrate the interior of the case, it stops at the planar region in the head top part, temporarily accumulates, and then flows down outwardly from the cover.

In the present invention, when the rear cover is attached to the cover, an interval is desirably provided between the first standing wall of the rear cover and the connector in order to prevent the first standing wall of the rear cover from being pressed against and compressing the connector.

Moreover, in the present invention, in order to prevent the infiltration of water into the interior of the case from side wall parts of the cover disposed on both sides of the connector, for example, when the rear cover is attached to the cover, the side wall parts are desirably of a length reaching an erecting part on the outer peripheral side of the first standing wall of the rear cover.

Moreover, in the present invention, for example, in order to prevent the infiltration of water from side wall portions other than the installation region of the connector, a second standing wall projecting in the direction of a ceiling wall of the cover is desirably further provided on the inner peripheral side of the side wall portions other than the installation region of the rear cover.

In addition to the first standing wall, this second standing wall also desirably forms the planar region in the head top part, such that this planar region has an inclined surface having a falling gradient facing outwardly from the cover configuring the case.

Moreover, in addition to the side wall parts of the cover disposed on both sides of the connector, side wall portions other than the installation region of the connector are also desirably of a length reaching the erecting part on the outer peripheral side of the second standing wall, when the rear cover is attached to the cover.

Because the second standing wall has the side walls of the cover on the outer peripheral side, there is no problem even if disposed below the printed circuit board. As this time, in order to prevent the second standing wall from being pressed against the printed circuit board and compressing the printed circuit board, an interval is desirably provided between the second standing wall and the printed circuit board.

Moreover, in the present invention, because the connector is attached so as to be placed on the printed circuit board, if the first standing wall is of the same height as the second standing wall, the interval between the connector and the first standing wall is larger than the interval between the printed circuit board and the second standing wall. Consequently, the height of the first standing wall is desirably formed so as to be higher than the height of the second standing wall.

In this case, the interval between the connector and the first standing wall is desirably an interval in which, for example, water accumulated at the planar region in the head top part of the first standing wall does not contact the connector. The reason for this is that, if water accumulated at the planar region in the head top part of the first standing wall contacts the connector, the accumulated water tends not to flow down along the gradient of the planar region so as to face outwardly from the cover.

Effect of the Invention

Because the present invention has an inclined surface having a falling gradient facing outwardly from the cover at the planar region in the head top part of the first standing wall of the rear cover, even if water infiltrates the case, this water stops at the planar region in the head top part of the first standing wall, temporarily accumulates, and then flows down outwardly from the cover. Consequently, the present invention can effectively prevent the infiltration of water into the interior of a case without the use of a sealant.

DESCRIPTION OF THE PREFERRED EMBODIMENT

An object of the present invention is to prevent the infiltration of a liquid, for example, water to the interior of a case without the use of a sealant.

In addition, the object is achieved by having an inclined surface with a falling gradient facing outwardly from the cover at the planar region in the head top part of the first standing wall formed in the portion of the rear cover in which at least the connector is installed.

EXAMPLES

One example for carrying out the present invention will hereinafter be described with reference to FIGS. 1 to 7.

Figure 5:
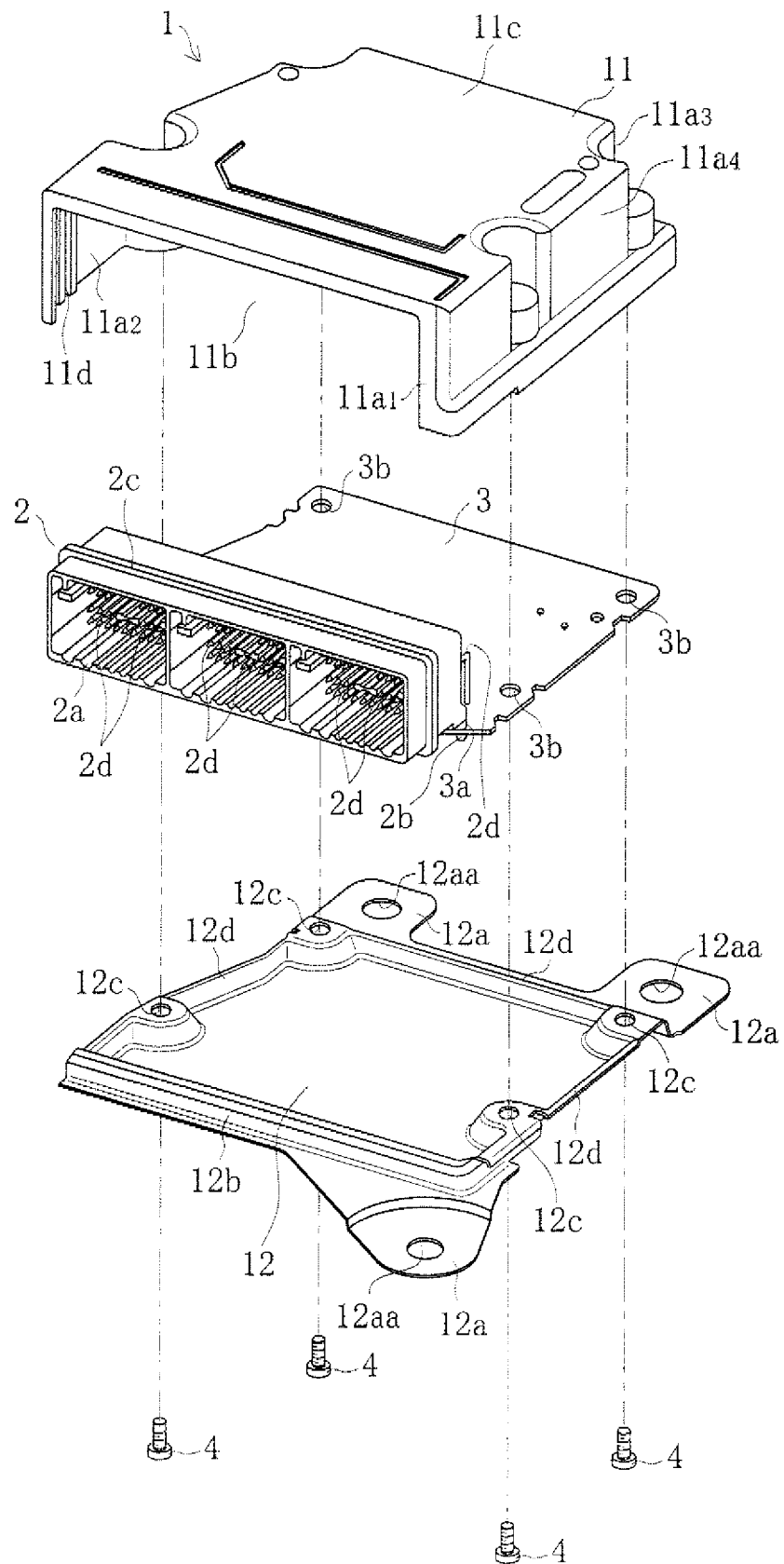
FIG. 5 is an exploded perspective view when the passenger protection control device according to the present invention is seen from the cover side.
Figure 6:
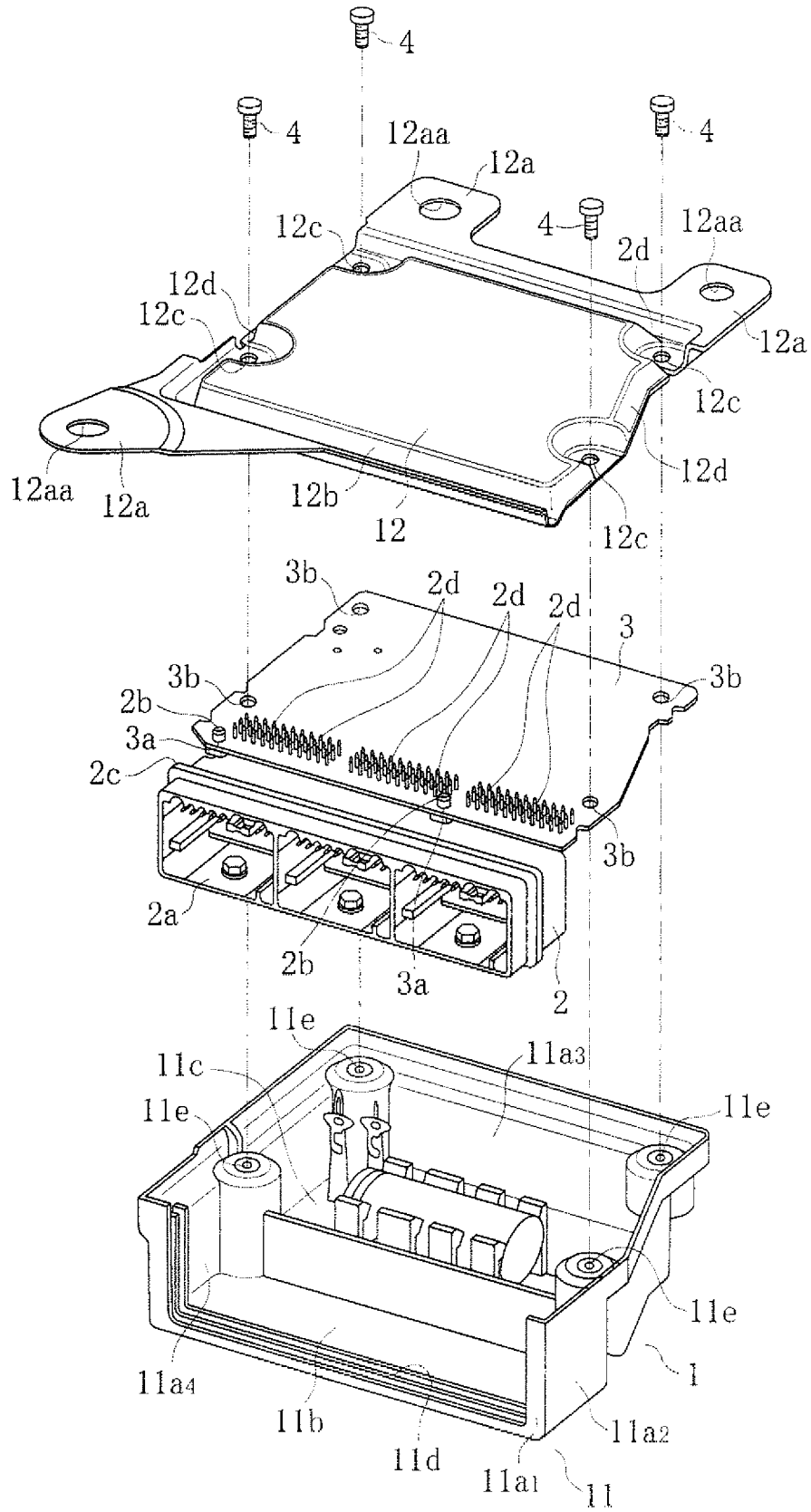
FIG. 6 is an exploded perspective view when the passenger protection control device according to the present invention is seen from the rear cover side.

As described with reference to FIGS. 5 and 6 in the background art, the passenger protection control device is configured to have a connector 2, a printed circuit board 3, and a case 1 which accommodates the connector 2 and the printed circuit board 3. Among these, the case 1, for example, is configured such that a resin cover 11 and a metal rear cover 12 are fastened using screw shafts 4 so as to be integrated.

For example, when a sensor, electronic element, etc. are mounted on the printed circuit board 3, and an automobile crash is determined based on the acceleration or deceleration detected by the sensor, a control circuit for outputting a control signal to deploy an air bag, for example, is printed on the printed circuit board 3.

A positioning hole 3a of the connector 2, for example, is provided at two locations on one end of this printed circuit board 3. Moreover, on both sides (the other end of the printed circuit board 3 and the central part closer to one end thereof), an insertion hole 3*b* of the screw shaft 4 for attaching the rear cover 12 to the cover 11, for example, is provided at four locations.

In contrast, a positioning pin 2*b* for insertion into the positioning hole 3*a* of the printed circuit board 3 is provided on the lower surface of the connector 2. In addition, when this positioning pin 2*b* is inserted into the positioning hole 3*a*, the connector 2 is attached to one end of the printed circuit board 3. In this attached state, a connection end surface 2*a* with a wire harness of the connector 2 faces outward. Moreover, a circular peripheral wall 2*c* is provided on the outer peripheral surface of the connector 2.

For example, with side walls $11a_1$ to $11a_4$ provided such that they hang down from the front, rear, left, and right of a ceiling wall 11*c*, the cover 11 has a box shape in which the periphery of this ceiling wall 11*c* is enclosed by the side walls and in which a floor surface is opened. In the side wall $11a_1$ for installing the connector 2 among the side walls $11a_1$ to $11a_4$, the installation region thereof is removed from below the floor surface side to provide an opening 11*b*. In addition, a groove 11*d* fitted to the circular peripheral wall 2*c* of the connector 2 is formed in the opening 11*b* part of the side wall $11a_1$. Moreover, a screw hole 11*e* of the screw shaft 4 for insertion into the insertion hole 3*b* of the printed circuit board 3 is provided at the attachment position of the printed circuit board 3 in the interior of the cover 11.

In contrast, the rear cover 12 plugs the floor surface of the cover 11, with an insertion hole 12*c* of the screw shaft 4 provided in a position coinciding with the screw hole 11*e* of the cover 11. Moreover, the flange 12*a*, which is projected outward so as to be exposed from the cover 11, is provided at three locations among four corners of the rear cover 12, with these flange 12*a* parts attached to a vehicle body. Moreover, a second standing wall 12*d* of a rear plate 12 is formed so as to protrude on the inner peripheral side of the side walls $11 a_2$ to $11 a_4$ of the cover 11 below the printed circuit board 3. In contrast, a first standing wall 12*b* of the rear plate 12 is formed so as to protrude in a portion disposed below the connector 2. In addition, the inner peripheral part of the printed circuit board 3 is enclosed by the first standing wall 12*b* and the second standing wall 12*d*.

In the abovementioned passenger protection control device, the positioning pin 2*b* of the connector 2 is inserted into a positioning hole 3*a* of the printed circuit board 3, while a contact terminal 2*d* of the connector 2 is connected to the control circuit printed on the printed circuit board 3 so as to attach the connector 2 to the printed circuit board 3. In this state, the circular peripheral wall 2*c* of the connector 2 is fitted to the groove 11*d* of the side wall $11a_1$ so as to position the connector 2 and the printed circuit board 3 with the cover 11.

In this state, because the screw holes 11*e* of the cover 11 coincide with the insertion holes 3*b* of the printed circuit board 3, the insertion holes 12*c* are made to coincide with the screw holes 11*e* and the insertion holes 3*b* so as to fasten and integrate rear cover 12 to the cover 11 using the screw shafts 4.

In this manner, while the connection end surface 2*a* with a wire harness of the connector 2 is exposed from the case 1, the printed circuit board 3 is enclosed by the cover 11 and the rear cover 12 so as to be isolated from the outside. The thus assembled passenger protection control device is attached to the vehicle body by inserting each bolt into a hole 12*aa* provided in the flange 12*a* of the rear cover 12.

Figure 2:
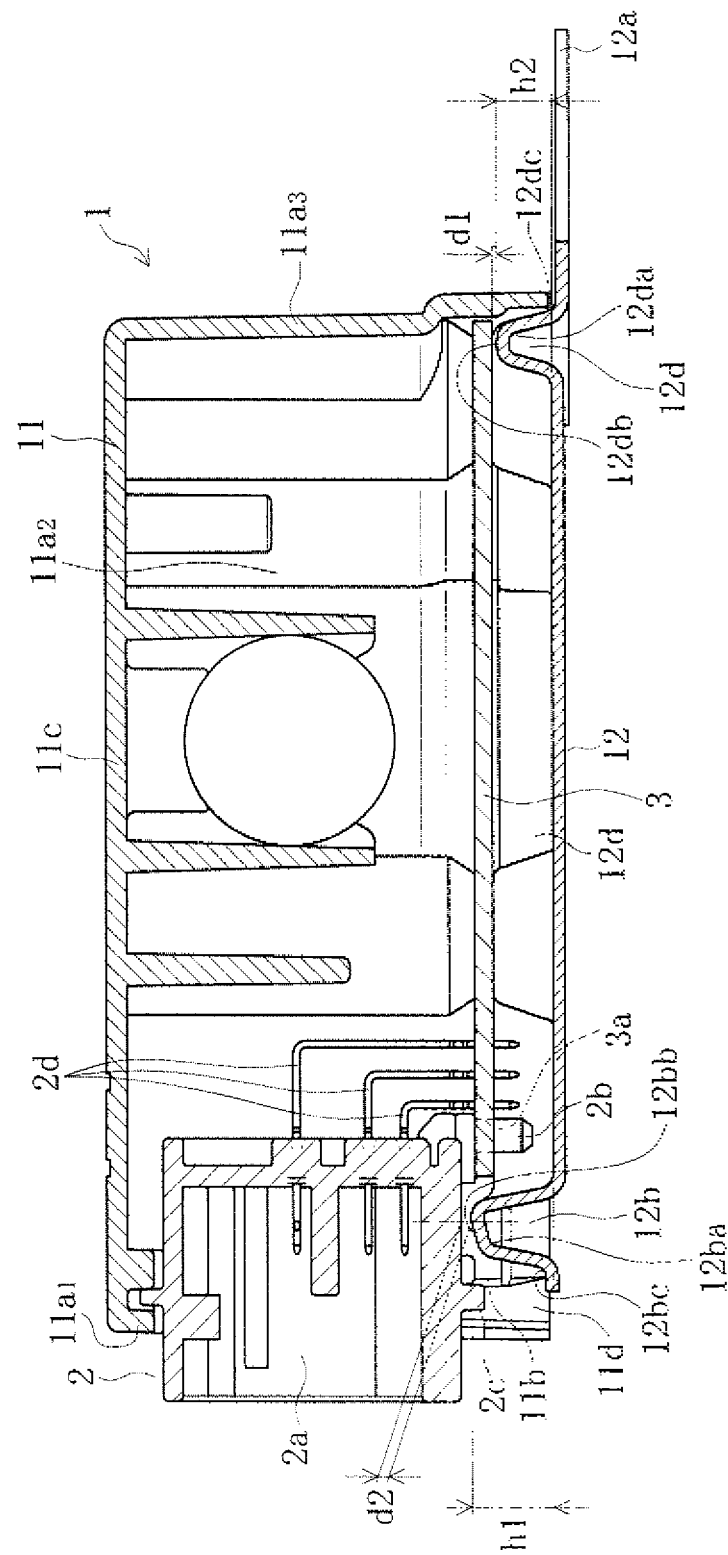
FIG. 2 is a view seen from the direction of the cross section of FIG. 1.
Figure 3:
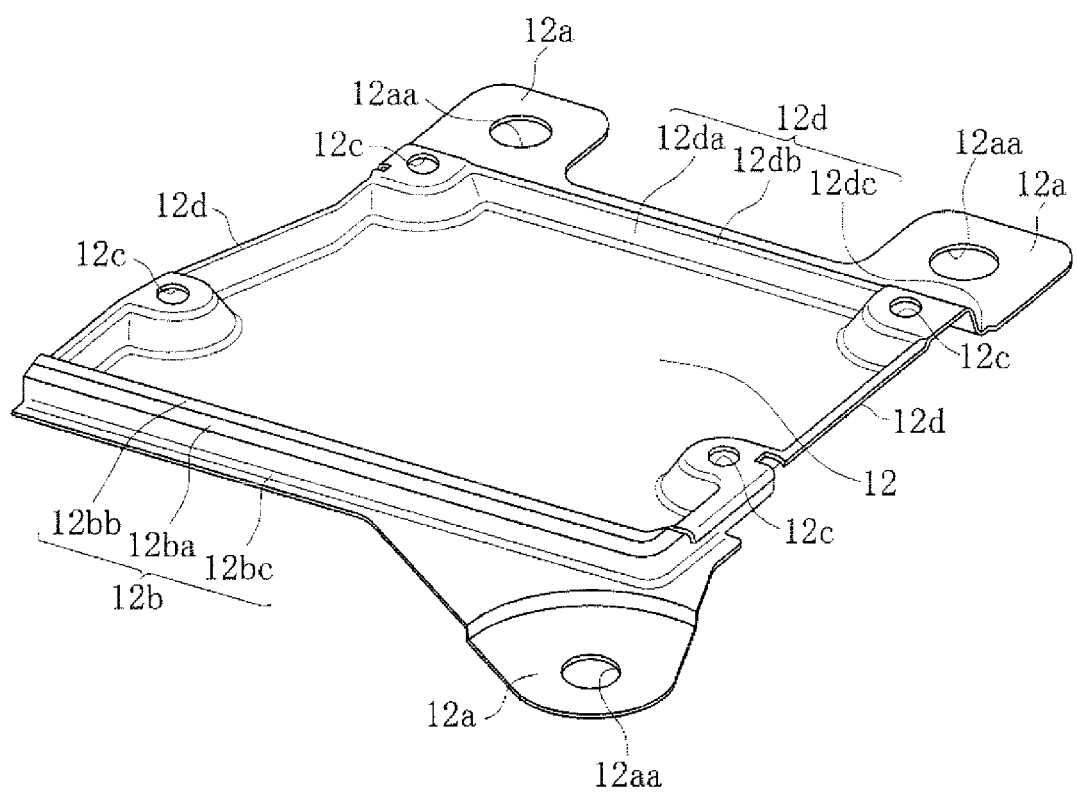
FIG. 3 is a perspective view when the rear cover configuring a case of the passenger protection control device according to the present invention is seen from the interior of the case.
Figure 4:
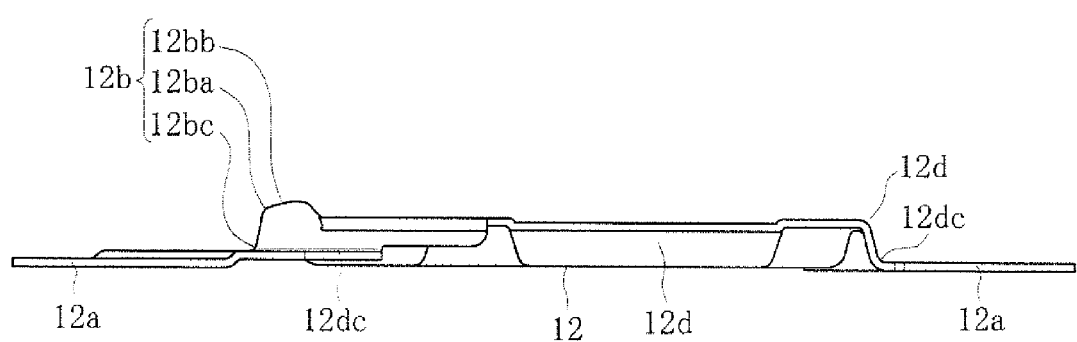
FIG. 4 is a side view of the rear cover configuring the case of the passenger protection control device according to the present invention.

As illustrated in FIG. 2, the thus assembled passenger protection control device has an interval between the first standing wall 12*b* of the rear cover 12 and the connector 2 as well as between the second standing wall 12*d* and the printed circuit board 3. In this manner, the first standing wall 12*b* and the second standing wall 12*d* are prevented from being pressed against and compressing the connector 2 and the printed circuit board 3.

Moreover, the passenger protection control device is attached with the connector 2 placed on the printed circuit board 3. Consequently, if the first standing wall 12*b* is of the same height as the second standing wall 12*d*, the interval d2 between the connector 2 and the first standing wall 12*b* is larger than the interval d1 between the printed circuit board 3 and the second standing wall 12*d*, causing water to have a tendency to infiltrate. Then, in the present example, the height h1 of the first standing wall 12*b* disposed below the connector 2 is formed so as to be higher than the height h2 of the second standing wall 12*d* disposed below the printed circuit board 3.

Figure 1:
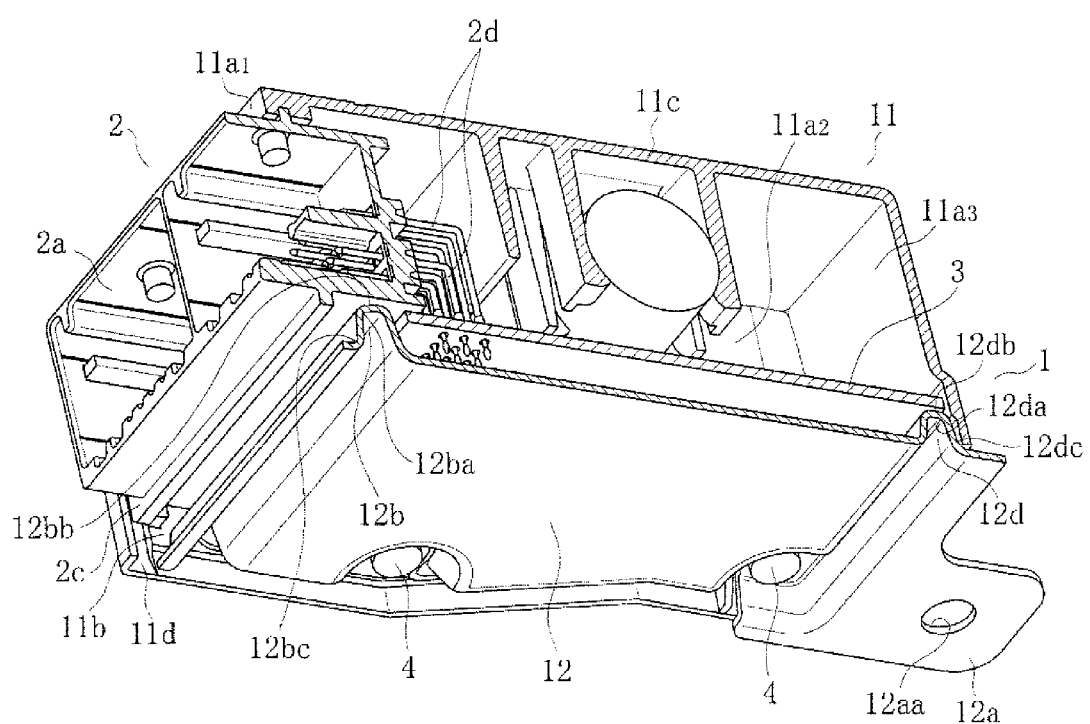
FIG. 1 is a longitudinal cross-sectional perspective view when the passenger protection control device according to the present invention is seen from the rear cover side.

In the present invention, as illustrated in FIGS. 1 and 2, a metal plate forming the rear cover 12, for example, is folded in a projection shape to form the first and second standing walls 12*b*, 12*d*, such that planar regions 12*bb*, 12*db* are formed in head top parts 12*ba*, 12*da*.

Moreover, in the present example, the interval d2 between the connector 2 and the planar region 12*bb* of the first standing wall 12*b* disposed below the connector 2 refers to an interval in which water 5 accumulated at the planar region 12*bb* in a head top part 12*ba* of the first standing wall 12*b* does not contact the connector 2.

Figure 7:
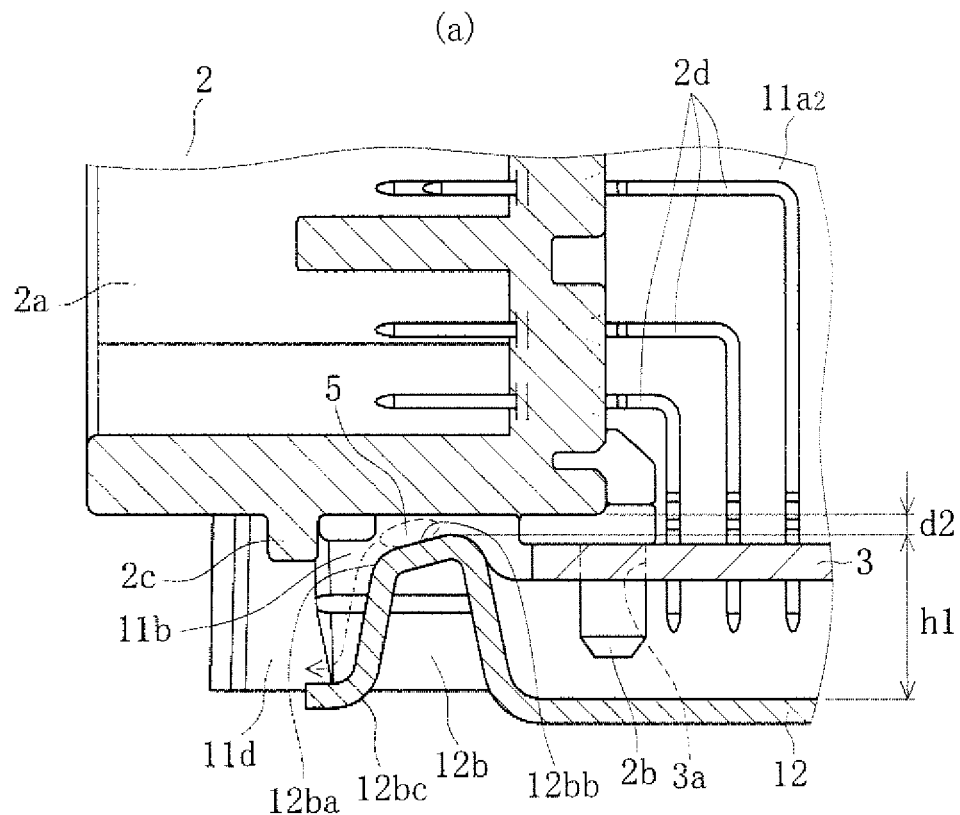
FIG. 7 is a view describing the effects of the configuration of the present invention, wherein (a) is a view employing the configuration of the present invention, while (b) is a view not employing the configuration of the present invention.
Figure 7:
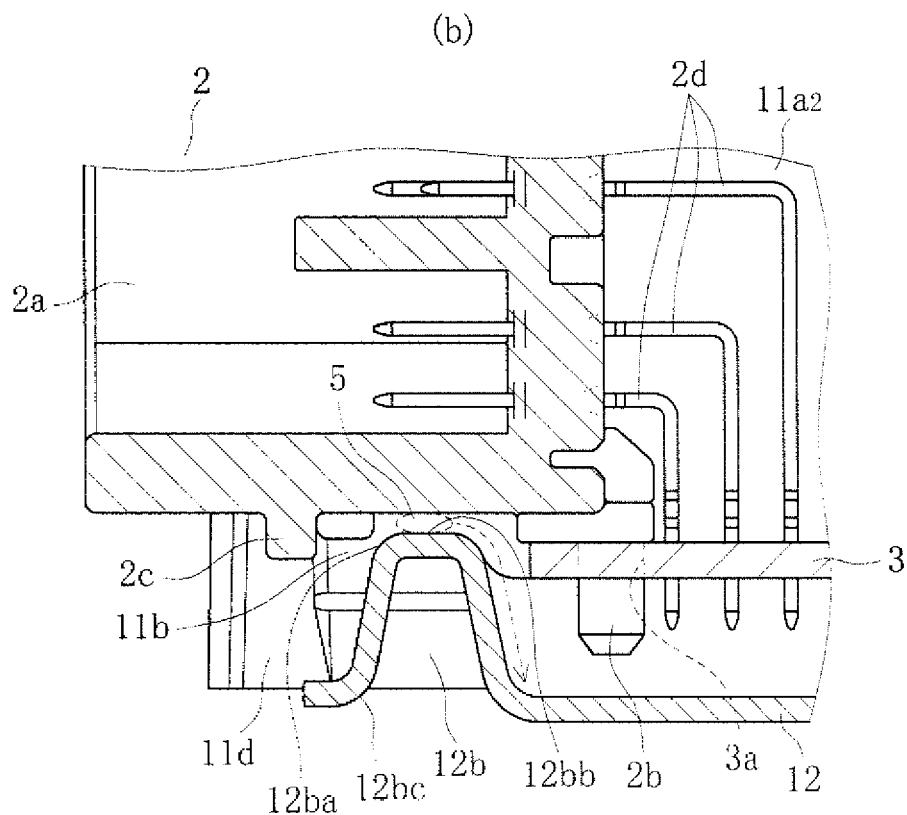
Figure 8:
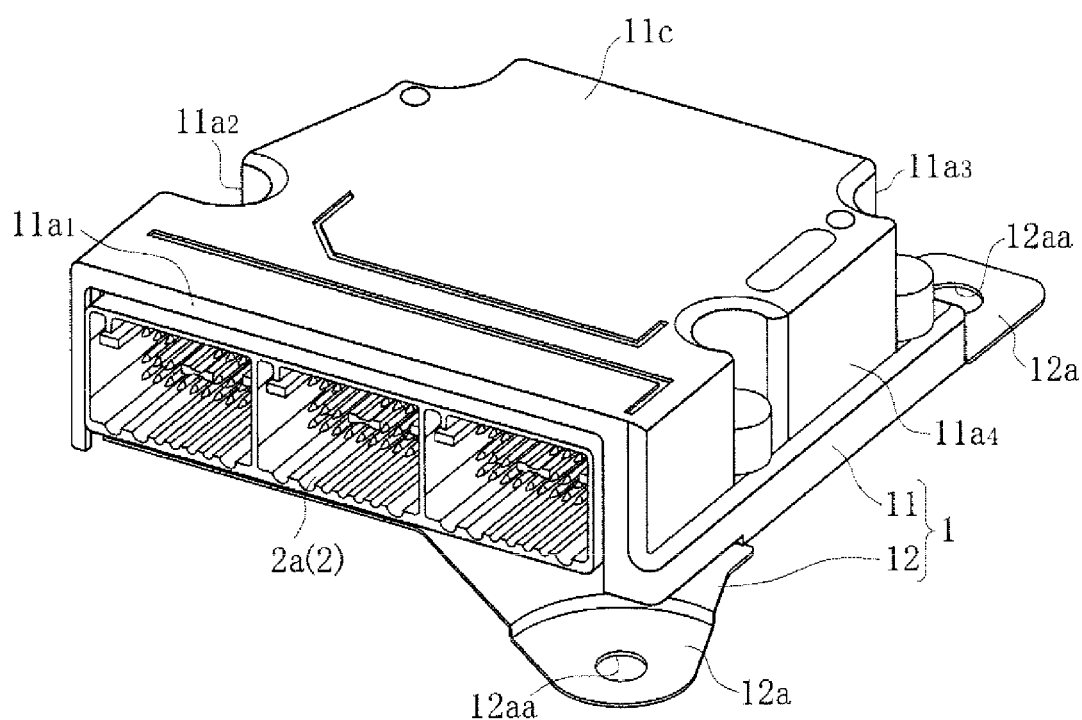
FIG. 8 is a perspective view when the passenger protection control device is seen from the cover side.

At this time, as illustrated in FIG. 7(*b*), if the planar region 12*bb* is horizontal, water 5, which is attempting to infiltrate the interior of the case 1, may flow in the case 1. If water 5 flows in the case 1, it will likely damage the printed circuit board 3.

Then, in the present invention, for example, the planar region 12*bb* in the head top part 12*ba* of the first standing wall 12*b* is formed so as to serve as an inclined surface having a falling gradient facing outwardly from the cover 11. In this case, the interval d2 refers to the interval of the narrowest portion among the intervals between the connector 2 and the planar region 12*bb*.

With such a configuration, as illustrated in FIG. 7(*a*), water, which is attempting to infiltrate the interior of the case 1, stops at the planar region 12*bb* in the head top part 12*ba* of the first standing wall 12*b*, temporarily accumulates, and then flows down outwardly from the cover 11 so as to be discharged outside the device.

Moreover, the cover 11 excluding the region for installing the connector 2 has the side walls $11a_1$ to $11a_4$. Consequently, in the present example, the side walls $11a_1$ to $11a_4$ are of a length reaching the vicinity of erecting parts 12*bc*, 12*dc* on the outer peripheral side of the first and second standing walls 12*b*, 12*d* of the rear cover 12, preventing the infiltration of water into the interior of the case 1 from these portions. In the present example, only the first standing wall 12*b* disposed below the connector 2 forms the planar region 12*bb* in the head top part 12*ba* on an inclined surface having a falling gradient facing outwardly from the cover.

The present invention is not limited to the abovementioned example, and embodiments may be appropriately changed as long as they are included in the category of technical ideas described in each claim.

That is, the passenger protection control device described above is a preferred embodiment of the present invention, with other embodiments also capable of being executed or implemented by various methods. Unless otherwise described as limitations in the specification of the present application, the present invention is not limited to the detailed components, sizes, configuration arrangements, etc. illustrated in the appended drawings. Moreover, the expressions and terms used in the specification of the present application are for the purpose of description and are not limited thereto unless otherwise limited thereto.

For example, as long as the entire periphery of the cover 11 is enclosed by the side walls, for example, the front, rear, left, and right side walls $11a_1$ to $11a$ may be separately configured, or may be integrally configured. Moreover, the housing 1 may be made of metal, in addition to resin. Moreover, the first standing wall 12b disposed below the connector 2, as well as the planar region 12db in the head top part 12da of the second standing wall 12d disposed below the printed circuit board 3, may be formed on an inclined surface having a falling gradient facing outwardly from the cover 11.

INDUSTRIAL APPLICABILITY

As described above, the passenger protection control device according to the present invention is not limited to that which controls the activation to deploy an air bag, it is effective in controlling any device such as engine control and power steering control.

REFERENCE NUMERALS

1 Case
11 Cover
$11a_1$ to $11a_4$ Side walls
11b Opening
11c Ceiling wall
12 Rear cover
12a Flange part
12b First standing wall
12ba Head top part
12bb Planar region
12bc Erecting part
12d Second standing wall
12da Head top part
12db Planar region
12dc Erecting part
2 Connector
2a Connection end surface
3 Printed circuit board
h1 Height of the first standing wall
h2 Height of the second standing wall
d1 Interval between the printed circuit board and the second standing wall
d2 Interval between the connector and the first standing wall

The invention claimed is:

1. A passenger protection control device, comprising: a printed circuit board with a control circuit for outputting a control signal printed thereon; a connector attached to the printed circuit board; and a case that accommodates such that, while a connection end surface with a wire harness of the connector is exposed, the printed circuit board is isolated from the outside, wherein the case comprises: a box shaped cover in which a periphery of a ceiling wall is enclosed by side walls and a floor surface is opened, with the connector installed in an opening provided on the side walls; and a rear cover that closes the floor surface of the box shaped cover, the rear cover being generally rectangular and having a first standing wall running along a length of a first side of thereof, the first standing wall projecting so as to face the connector in a portion of the box shaped cover in which the connector is installed, wherein the first standing wall of the rear cover has a planar region running the length of the first side in a head top part, the planar region having an inclined surface with a falling gradient facing outwardly from the box shaped cover, and wherein the planar region with the inclined surface is spaced from the connector such that an opening is defined between the planar region and the connector that facilitates a flow of accumulated water outwardly down from the rear cover.

2. The passenger protection control device according to claim 1, wherein an interval is provided between the first standing wall of the rear cover and the connector.

3. The passenger protection control device according to claim 1, wherein, when the rear cover is attached to the box shaped cover, side wall parts of the cover disposed on both sides of the connector are of a length reaching an erecting part on an outer peripheral side of the first standing wall of the rear cover.

4. The passenger protection control device according to claim 1, wherein the rear cover further comprises a flange for attachment to a vehicle body projecting outwardly from the box shaped cover.

5. The passenger protection control device according to claim 3, wherein the rear cover further comprises a flange for attachment to a vehicle body projecting outwardly from the box shaped cover.

6. The passenger protection control device according to claim 1, wherein the rear cover further comprises a second standing wall projecting in a direction of the ceiling wall of the cover, on an inner peripheral side of side wall portions other than an installation region of the connector.

7. The passenger protection control device according to claim 3, wherein the rear cover further comprises a second standing wall projecting in a direction of the ceiling wall of the cover, on an inner peripheral side of side wall portions other than an installation region of the connector.

8. The passenger protection control device according to claim 4, wherein the rear cover further comprises a second standing wall projecting in a direction of the ceiling wall of the cover, on an inner peripheral side of side wall portions other than an installation region of the connector.

9. The passenger protection control device according to claim 6, wherein the second standing wall has a planar region in the head top part, while the planar region has an inclined surface having a falling gradient facing outwardly from the box shaped cover.

10. The passenger protection control device according to claim 7, wherein the second standing wall has a planar region in the head top part, while the planar region has an inclined surface having a falling gradient facing outwardly from the box shaped cover.

11. The passenger protection control device according to claim 6, wherein the second standing wall of the rear cover is disposed below the printed circuit board.

12. The passenger protection control device according to claim 7, wherein the second standing wall of the rear cover is disposed below the printed circuit board.

13. The passenger protection control device according to claim 6, wherein an interval is provided between the second standing wall of the rear cover and the printed circuit board.

14. The passenger protection control device according to claim 7, wherein an interval is provided between the second standing wall of the rear cover and the printed circuit board.

15. The passenger protection control device according to claim 6, wherein a first height of the first standing wall disposed below the connector is formed so as to be higher than a second height of the second standing wall.

16. The passenger protection control device according to claim 7, wherein a first height of the first standing wall disposed below the connector is formed so as to be higher than a second height of the second standing wall.

17. The passenger protection control device according to claim 6, wherein, when the rear cover is attached to the box shaped cover, portions other than the installation region of the connector on the side walls are of a length reaching an erecting part on an outer peripheral side of the second standing wall of the rear cover.

18. The passenger protection control device according to claim 7, wherein, when the rear cover is attached to the box shaped cover, portions other than the installation region of the connector on the side walls are of a length reaching an erecting part on an outer peripheral side of the second standing wall of the rear cover.

19. The passenger protection control device according to claim 2, wherein the interval between the connector and the first standing wall disposed below the connector is an interval that stops infiltration into the case at the planar region formed in the head top part of the first standing wall so as to prevent an accumulated liquid from contacting the connector.

20. The passenger protection control device according to claim 3, further comprising an interval between the connector and the first standing wall disposed below the connector that stops infiltration into the case at the planar region formed in the head top part of the first standing wall so as to prevent an accumulated liquid from contacting the connector.

21. The passenger protection control device according to claim 6, further comprising an interval between the connector and the first standing wall disposed below the connector that stops infiltration into the case at the planar region formed in the head top part of the first standing wall so as to prevent an accumulated liquid from contacting the connector.

* * * * *